(12) United States Patent
Stollwerck et al.

(10) Patent No.: US 11,280,815 B2
(45) Date of Patent: Mar. 22, 2022

(54) VOLTAGE INDICATION DEVICE

(71) Applicant: 3M INNOVATIVE PROPERTIES COMPANY, St. Paul, MN (US)

(72) Inventors: Gunther A. J. Stollwerck, Krefeld (DE); Harald Westkamp, Hattingen (DE); Mark Gravermann, Erkelenz (DE); Jens Weichold, Erkelenz (DE)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 16/961,974

(22) PCT Filed: Jan. 22, 2019

(86) PCT No.: PCT/IB2019/050540
§ 371 (c)(1),
(2) Date: Jul. 14, 2020

(87) PCT Pub. No.: WO2019/145859
PCT Pub. Date: Aug. 1, 2019

(65) Prior Publication Data
US 2020/0363456 A1      Nov. 19, 2020

(30) Foreign Application Priority Data
Jan. 29, 2018   (EP) .................................... 18153805

(51) Int. Cl.
*G01R 19/155*   (2006.01)

(52) U.S. Cl.
CPC .................................. *G01R 19/155* (2013.01)

(58) Field of Classification Search
None
See application file for complete search history.

(56) References Cited

U.S. PATENT DOCUMENTS

| 4,263,550 A | * | 4/1981 | Schweitzer, Jr. | .... G01R 19/155 324/120 |
| 4,794,331 A | * | 12/1988 | Schweitzer, Jr. | ...... G01R 19/14 324/133 |

(Continued)

FOREIGN PATENT DOCUMENTS

| DE | 4408818 | 5/1995 |
| DE | 29719119 | 5/1999 |

(Continued)

OTHER PUBLICATIONS

International Search Report for PCT International Application No. PCT/IB2019/050540, dated Mar. 27, 2019, 4 pages.

*Primary Examiner* — Jas A Sanghera
(74) *Attorney, Agent, or Firm* — Gregg Rosenblatt; 3M Innovative Properties Compa

(57) ABSTRACT

Voltage indication device (2), attachable to a medium-voltage separable plug having a rear insert comprising a coupling electrode. The voltage indication device comprises a body (241) and a voltage detector (251) having a ground contact (361), a voltage contact (261) for electrical connection to the coupling electrode; and an indicator for visually indicating presence of the medium voltage in the separable plug. The body comprises an elastically expandable support portion (406) for resiliently supporting the voltage detector (251).

16 Claims, 4 Drawing Sheets

(56) References Cited

U.S. PATENT DOCUMENTS

Figure 1:
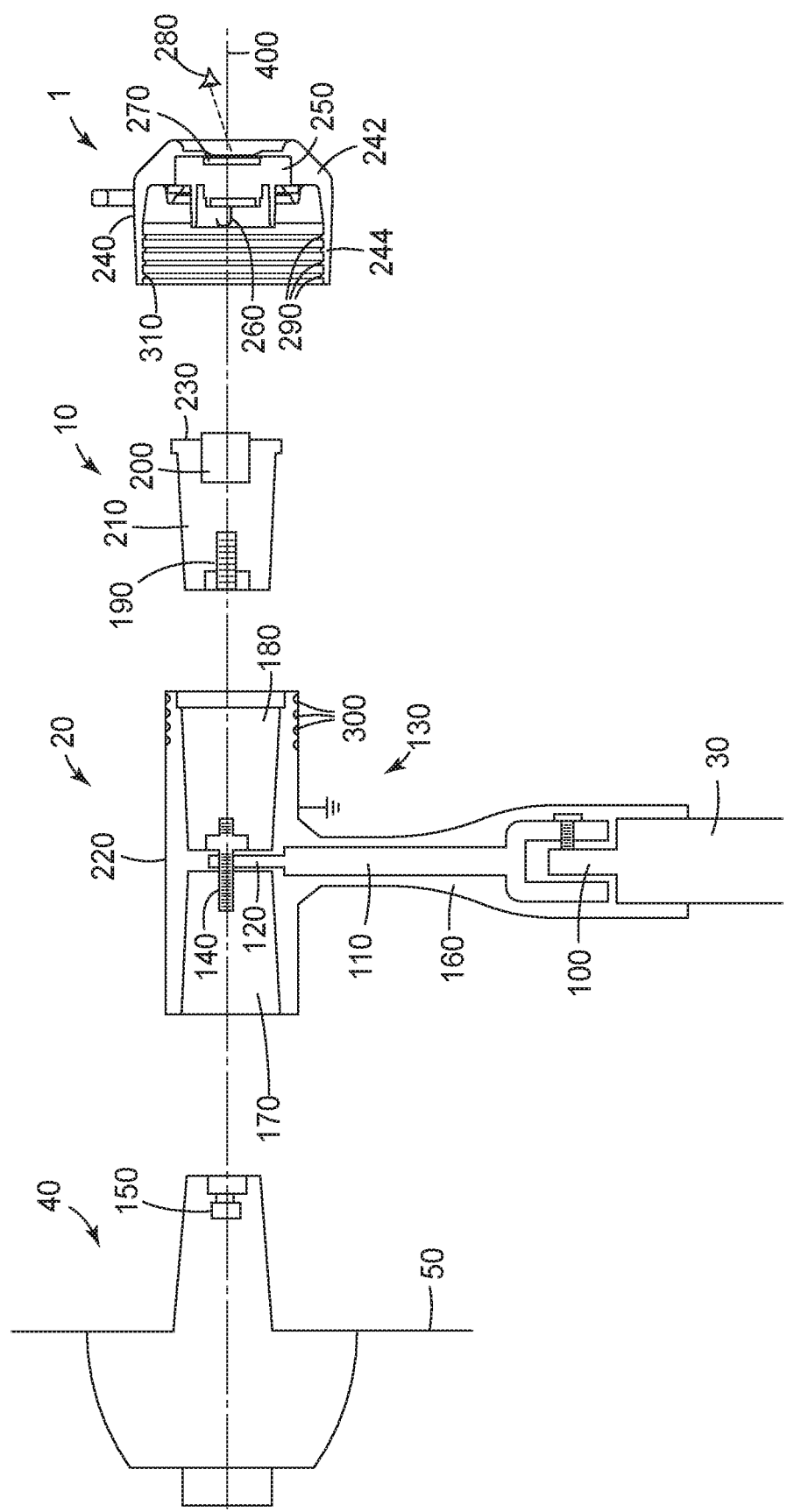

| | | | | |
|---|---|---|---|---|
| 7,611,378 B1* | 11/2009 | Brekosky | ........... | H01R 13/5202 |
| | | | | 439/500 |
| 2006/0189173 A1* | 8/2006 | Negle | .................... | H01R 13/53 |
| | | | | 439/6 |
| 2007/0141882 A1* | 6/2007 | Stepniak | ................ | H01R 13/53 |
| | | | | 439/187 |

FOREIGN PATENT DOCUMENTS

| FR | 2689248 | 10/1993 |
|---|---|---|
| WO | 2003-107560 | 12/2003 |

\* cited by examiner

VOLTAGE INDICATION DEVICE

The present disclosure relates to indication devices that indicate the presence or absence of elevated voltages in high-voltage and medium-voltage electrical power distribution networks. It relates in particular to such indication devices that can be attached to separable plugs which are used to connect power cables to switchgears, transformers, or other power network apparatus. It also relates to kits of parts for assembling such indication devices, and to processes for attaching such indication devices.

Where human installers perform installation or maintenance on electrical apparatus or power cables in medium-voltage or high-voltage power networks, such as national grids, it is essential for their safety that they can easily recognize which elements are on elevated (i.e. medium or high) voltage. In particular, where power connectors, such as separable plugs, on ends of power cables are being handled, it is desirable to provide an indication to the installer if a power connector is on elevated voltage or not.

The French patent application publication FR 2 689 248 A1 describes a voltage indicator for indicating presence of voltage in an electrical circuit. It comprises a bridge with two capacitors connected in series between a power line and earth. A neon lamp is connected to the bridge and earth via a resistor. The voltage on the resistor is applied to an amplifier supplied from an auxiliary power supply. The amplifier generates a signal which is applied to an indicating lamp and a relay.

It is desirable that a voltage indicator is a rugged piece of equipment that can survive mechanical impacts, vibration, or shock. It is also desirable that the voltage indicator can be repaired easily and cost-effectively after failure or damage. It is further desirable that slight variations in size or shape of a contact of a voltage indicator do not lead to unreliable indication of the medium voltage.

In an attempt to address such needs, the present disclosure provides a voltage indication device, attachable to a medium-voltage separable plug in a power distribution network of a national grid, wherein the separable plug has a rear insert comprising a coupling electrode, and wherein the voltage indication device comprises
a) a body, and
b) a voltage detector, supported by the body, for detecting presence of a medium voltage in the separable plug, the voltage detector comprising
 a ground contact for electrical connection to ground;
 a voltage contact for electrical connection to the coupling electrode; and
 an indicator for visually indicating presence of the medium voltage in the separable plug,
characterized in that the body comprises an elastically expandable support portion for resiliently supporting the voltage detector, and in that the ground contact comprises a spring contact.

The elastically expandable support portion of the body provides for a resilient support of the voltage detector, so that vibration or shock will elastically deform the support portion, but not—or to a lesser degree—affect the voltage detector.

The resilient support of the voltage detector may allow for a greater variation in size of the contacts of the voltage detector. If, for example, the voltage contact is slightly too short to contact the coupling electrode, the resilient support portion may push the entire voltage detector towards the coupling electrode, so that the short voltage contact is in a reliable electrical connection with the coupling electrode.

The term "medium voltage" (or "MV") as used herein refers to a voltage in the range of about 1 kV (kilovolt) to about 72 kV versus ground.

Separable plugs or separable connectors are a certain type of electrical connectors at ends of MV power cables, to connect such cables to MV switchgears, transformers or similar types of large electrical apparatus in power distribution networks. Certain separable plugs are referred to as elbow plugs or T-bodies or T-connectors, due to their outer shape. Separable plugs that may be used with a voltage indication device according to the present disclosure are, for example, shown in the German patent DE 4408818 C1 or in the International patent application WO 03/107560 A1.

Such separable plugs typically provide a tubular cable receptacle to receive the cable end, and a first cavity for receiving a corresponding protrusion of the apparatus. This first cavity often has the shape of a truncated cone and its axis is oriented orthogonally to the direction of the cable receptacle. A second frusto-conical cavity extends long the same axis, but opens in the opposite direction. Both cavities and the cable receptacle are formed in an electrically insulating plug body. Located centrally between the cavities, a contact element, connected to the cable conductor and therefore on elevated voltage when in use, facilitates mechanical and electrical connection to the apparatus, e.g. by a screw. When the plug is properly positioned for attachment to the apparatus, the contact element is accessible for mechanical fastening to the apparatus through the second cavity.

After fastening, an electrically insulating rear insert, formed frusto-conically to fill the second cavity, is positioned in the second cavity and attached to the contact element by a conductive thread comprised in the rear insert. The rear insert provides electrical insulation to reduce the risk of voltage breakdown between the contact element or the conductive thread on elevated voltage and the outer surface of the separable plug held on electrical ground. For safety, the outer, i.e. accessible, surface of the plug is held on electrical ground, so that it is safe to touch. Similarly, the accessible outer surface of the rear insert is also held on ground potential.

Certain rear inserts further comprise a coupling electrode, embedded in the insulating material of the rear insert, and capacitively coupled to the conductive thread. The coupling electrode is sometimes used by installers as a contact for a hand-held voltage indicator. For that purpose, a portion of the coupling electrode is accessible on the outer surface of the rear insert. Typically, the rear insert, the conductive thread and the coupling electrode are arranged coaxially, and when in use, their axis and the axes of the cavities are identical.

The conductive thread of the rear insert is connected to the medium voltage of the cable conductor. The coupling electrode of the rear insert is spatially separated from the conductive thread by a portion of the insulating material of the rear insert. By virtue of this arrangement, the conductive thread and the coupling electrode form electrodes of a capacitor, the dielectric of which is formed by a portion of the insulating material of the rear insert located between these electrodes. When medium voltage is present on the cable conductor, the conductive thread is on the same voltage. Due to the capacitive coupling, a voltage (the "detection voltage") is then also present on the coupling electrode, although this voltage is somewhat lower than the medium voltage of the cable conductor, depending on the capacitance of the capacitor formed by the conductive thread, the coupling electrode and the insulating material between them.

A voltage indication device according to the present disclosure detects the presence of medium voltage on the cable conductor by sensing the detection voltage via an electrical surface contact with the coupling electrode. For that purpose, the voltage indication device comprises a voltage contact for electrical connection to the coupling electrode. This voltage contact may, for example, be formed as a spring contact, which comprises a resilient conductive element. Alternatively, the voltage contact may be formed, for example, by a conductive screw or a conductive portion of a housing of the voltage detector. In any case, the voltage contact may be adapted to provide a resilient surface contact with the coupling electrode when the voltage indication device is attached to the separable plug. The voltage contact may be electrically connected to an electronic circuit on a printed circuit board ("PCB") in the voltage detector.

The voltage indication device of the present disclosure may take its power from the medium voltage of the cable through the coupling electrode of the rear insert.

The voltage indication device of the present disclosure detects medium voltage on the conductive thread relative to electrical ground and is therefore connected to electrical ground. For that purpose, the voltage indication device comprises a ground contact for electrical connection to ground. This ground contact may, for example, be formed as a spring contact, which comprises a resilient conductive element. In certain embodiments, the ground contact is adapted to secure a grounding wire therewith, e.g. by soldering or via an insulation displacement contact comprised in the ground contact.

In certain embodiments, in which the voltage detector comprises a housing, the housing is electrically conductive and is connected to electrical ground.

In certain embodiments the ground contact may be adapted to provide a surface contact with the body of the voltage indication device, which body may be electrically conductive to provide an electrical connection to a grounded outer surface of the separable plug. Generally, the ground contact may be electrically connected to an electronic circuit on a printed circuit board ("PCB") in the voltage detector.

The voltage detector is electrically connected between the medium voltage of the cable and ground. It uses a voltage divider to determine presence of a medium voltage in the cable. The voltage divider is formed by two impedances, connected in series between the medium voltage and ground: The first impedance is the capacitor formed by the conductive thread and the coupling electrode of the rear insert. The second impedance is arranged inside the voltage detector and is electrically connected between the voltage contact and the ground contact of the voltage detector. This second impedance may be formed by one or more capacitors, one or more resistors, or one or more inductances.

The voltage divider divides the medium voltage of the conductive thread such that between the first impedance and the second impedance a detection voltage can be picked up that is indicative of the medium voltage of the conductive thread and varies proportionally with it. The proportionality factor is the "dividing ratio", which is the ratio of the impedance values of the first impedance and of the second impedance.

Suitable dividing ratios for detecting medium voltages may be in the range of about 1:10 to about 1:100'000. Preferred dividing ratios are in the range of about 1:100 to about 1:10'000. A particularly preferred dividing ratio is about 1:1000, because it results in a detection voltage of between 1 V and 100 V, which is high enough to be easy to detect and low enough to pose little safety risks.

Where the first impedance is the capacitor formed by the conductive thread and the coupling electrode, this capacitor may have a capacitance of about 1 pF (picofarad) to about 3 pF, for example. The second impedance may also be a capacitor, which may have a capacitance of about 100 pF (picofarad) to about 1 nF (nanofarad).

The detection voltage, picked up at the coupling electrode, may be used to power the voltage detector and in particular the indicator of the voltage detector.

In one aspect of the present disclosure, the voltage detector may comprise a housing. The housing may be rigid. The housing may generally have an electrically insulating outer surface. Alternatively, the housing is electrically conductive. In certain embodiments, the housing of the voltage detector is electrically conductive and is electrically connected to electrical ground. In other, alternative embodiments, the voltage has no housing.

In an aspect of the disclosure, one or more conductive surface portions of the housing may form the ground contact. One or more conductive surface portions of the housing may form the voltage contact. In certain embodiments, the housing comprises a first electrically conductive surface portion. The first electrically conductive surface portion of the housing may form the ground contact. Alternatively, the first electrically conductive surface portion of the housing may form the voltage contact.

In some of these embodiments, the housing comprises a first electrically conductive surface portion and a second electrically conductive surface portion, electrically insulated from the first conductive surface portion. The first electrically conductive surface portion of the housing forms the ground contact. The second electrically conductive surface portion of the housing forms the voltage contact.

The voltage detector comprises an indicator for visually indicating a presence of a medium voltage in the separable plug, in particular in the conductive thread of the separable plug. Because the conductive thread is in electrical contact with the cable conductor, the medium voltage of the cable conductor is also present in the conductive thread.

In certain embodiments, the indicator is an LCD display that displays some form of indicia, such as a flash sign, a symbol, or the word "ON", to indicate presence of the medium voltage. The LCD display may remain dark or display a different indicia, symbol, or word, to indicate absence of the medium voltage.

In other embodiments, the indicator is a light-emitting diode (LED) or, generally, a light-emitting device, which emits light when medium voltage is present, and emits no light when no medium voltage is present.

The indicator may take other forms and/or visually indicate presence of medium voltage by other means, for example by position of a mechanical element, colour of a surface, frequency of light emission, or a similar visual effect. The indicator may comprise, for example, an organic light-emitting diode (OLED), electronic paper, or an electroluminescent element.

The indicator is preferably visible from outside the voltage indication device. It should thus not be obstructed by portions of the body of the voltage indication device. The indicator may be arranged close to the surface of a housing of the voltage detector. In certain preferred embodiments, the indicator is comprised in the outer surface of the voltage detector. This may help ensure good visibility of the indicator.

The body of the voltage indication device of the present disclosure supports the voltage detector of the device. For the voltage indication device to be particularly rugged, the voltage detector is supported resiliently. The resilient support is provided by an elastically expandable support portion of the body.

The term "expandable" refers to a property of an element of being expandable, i.e. can be enlarged in size, e.g. elongated, at operating temperatures, in at least one dimension without being destroyed or damaged. The term "compressible" refers to a property of an element of being compressible, i.e. can be reduced in size, e.g. shortened, at operating temperatures, in at least one dimension without being destroyed or damaged. "Elastic" refers to the property of an element, upon non-permanent expansion or compression at operating temperatures, striving to return into its original shape. "Resilience" is a property resulting from an element being elastic. Due to its elastic properties, an elastic element can generally provide resilient support, e.g. for the voltage detector. All these terms are thus used in their normal technical meaning.

Elasticity of a material can be quantified by its Shore hardness. Materials suitable for use in an elastically expandable support portion of a voltage indication device according to the present disclosure may have a Shore A hardness of between about 20 and about 90, preferred materials may have a Shore A hardness of between about 30 and about 50. Shore A hardness can be determined by using the test methods in ASTM D2240.

Operating temperatures for voltage indication devices according to the present disclosure are temperatures of between about −20° C. and about +80° C.

The shape of the body is not particularly limited. In certain embodiments, the body has a generally axial-symmetric concave shape, e.g. resembling a cap or an end cap or a twist-on cap of a water bottle. Such bodies may be particularly suitable for arrangement over the exposed surface of the rear insert.

Independent of the shape of the body, the body may be formed as a single piece, e.g. molded as a single piece. The body may be formed as a single inseparable body. Alternatively, the body may be formed by multiple elements, connected with each other to form the body.

The body may be shaped to form an open-cylindrical cavity, forming a first end face of the open-cylindrical cavity, in which the opposed second end face is open. Generally, the body may be axially symmetric. An axially symmetric body may be arrangeable on the separable plug such that its symmetry axis aligns with a symmetry axis of the rear insert. This may provide for a space-saving arrangement of the voltage indication device and enhanced ease of attachment.

The entire body may be elastically expandable and/or elastically compressible. It may be made from, or comprise, a polymeric material, such as silicone, or EPDM rubber. It may be made from, or comprise, a thermoplastic elastomer. Such polymeric materials may provide elastic expandability and/or compressibility. An elastic body (i.e. an elastically expandable or elastically compressible body) may facilitate resilient support for the voltage detector.

The body may comprise an electrically conductive portion or it may be electrically conductive. It may, for example, be made of an electrically conductive polymer. This may allow the body to be connected to electrical ground and to serve as a grounding element to the voltage detector, or to electrically connect the ground contact of the voltage detector to a grounded portion of the separable plug.

The body may be made of an electrically conductive polymer and be elastically expandable. An elastically expandable body, made of a conductive polymer like, for example, conductive silicone, conductive EPDM rubber or an electrically conductive thermoplastic elastomer, may serve as a grounding element, making the provision of an additional grounding element obsolete.

The body may comprise a holding element for attaching the voltage indication device to the separable plug. In certain embodiments, the body comprises holding elements such as protrusions and/or recesses, suitably shaped to engage with a corresponding structure, e.g. recesses and/or protrusions, on the outer surface of the separable plug to attach the voltage indication device to the separable plug.

In other embodiments, the body forms a tubular inner surface portion comprising an inner diameter. Before elastic expansion, the inner diameter may be slightly smaller than an outer diameter of a portion of a separable plug to which the voltage indication device is to be attached. This may allow attachment to the separable plug by elastic expansion of the body and subsequent frictional engagement between the inner surface portion of the peripheral body portion and the outer surface of the separable plug. Generally, for attachment of the voltage indication device to a separable plug, the body may be suitably adapted for frictional engagement between the body and the separable plug.

Generally, the body may have a central body portion and a peripheral body portion. The central body portion may be flat or have a flat portion. Alternatively, the central body portion may have the shape of a surface curved in one or two directions. In certain embodiments, the central body portion is axially symmetric. The body may be arrangeable on the separable plug such that a symmetry axis of the central body portion aligns with a symmetry axis of the rear insert.

The central body portion may be elastically expandable and/or elastically compressible. Alternatively, the central body portion may be rigid. The central body portion may form, or may comprise, the elastically expandable support portion for resiliently supporting the voltage detector.

The central body portion may be shaped suitably to support and affix the voltage detector, e.g. in the body. The central body portion may form a detector cavity to receive and resiliently support the voltage detector. The central body portion may comprise holding features, such as a recess, a protrusion or a flange to affix the voltage detector to the central body portion.

The indicator of the voltage detector may be arranged in the vicinity of the central body portion. The central body portion may comprise an aperture to allow visual perception of the indicator through the aperture. Alternatively, the central body portion may comprise a transparent or translucent window to allow visual perception of the indicator through the window.

The central body portion may comprise an electrically conductive portion. It may, for example, be made of an electrically conductive polymer. This may allow the central body portion to be connected to electrical ground and to serve as a grounding element to the voltage detector, or to electrically connect the ground contact of the voltage detector to a grounded portion of the separable plug.

The central body portion may be made of an electrically conductive polymer and be elastically expandable. An elastically expandable central body portion, made of a conductive polymer like, for example, conductive silicone, conductive EPDM rubber or an electrically conductive thermoplastic elastomer, may provide resilient support for the voltage detector and serve as a grounding element, making the provision of an additional grounding element obsolete.

A peripheral body portion may be connected to the central body portion, e.g. at a peripheral edge of the central body portion. In certain embodiments, the central body portion and the peripheral body portion are formed as a single piece, e.g. molded as a single piece.

Where the central body portion comprises a flat surface, the peripheral body portion may extend from the body portion in a direction generally orthogonal to the surface. The central body portion and the peripheral body portion may be shaped to form an open-cylindrical cavity, in which the central body portion forms an end face of the open-cylindrical cavity, and in which the opposed end face is open.

The peripheral body portion may be elastically expandable. Alternatively, the central body portion may be rigid.

The peripheral body portion may comprise an electrically conductive portion or it may be electrically conductive. It may, for example, be made of an electrically conductive polymer. This may allow the peripheral body portion to be connected to electrical ground and to serve as a grounding element to the voltage detector, or to electrically connect the ground contact of the voltage detector to a grounded portion of the separable plug.

The peripheral body portion may be made of an electrically conductive polymer and be elastically expandable. An elastically expandable peripheral body portion, made of a conductive polymer like, for example, conductive silicone, conductive EPDM rubber or an electrically conductive thermoplastic elastomer, may serve as a grounding element, making the provision of an additional grounding element obsolete.

The peripheral body portion may comprise a holding element for attaching the voltage indication device to the separable plug. In certain embodiments, the peripheral body portion comprises holding elements such as protrusions and/or recesses, suitably shaped to engage with a corresponding structure, e.g. recesses and/or protrusions, on the outer surface of the separable plug to attach the voltage indication device more reliably to the separable plug.

In other embodiments, the peripheral body portion forms a tubular inner surface portion comprising an inner diameter. The inner diameter may be slightly smaller than an outer diameter of a portion of the separable plug to which the voltage indication device is to be attached. This may allow attachment to the separable plug by elastic expansion and subsequent frictional engagement between the inner surface portion of the peripheral body portion and an outer surface of the separable plug. Generally, for attachment of the voltage indication device to a separable plug, the peripheral body portion may be suitably adapted for frictional engagement between the peripheral body portion and the separable plug.

The body comprises an elastically expandable support portion for resiliently supporting the voltage detector. Where the body has a central body portion and a peripheral body portion, the support portion may be comprised in the central body portion or the peripheral body portion.

The support portion may comprise an electrically conductive portion or it may be electrically conductive. It may, for example, be made of an electrically conductive polymer. This may allow the support portion to be connected to electrical ground and to serve as a grounding element to the voltage detector, or to electrically connect the ground contact of the voltage detector to a grounded portion of the separable plug.

It may be desirable to manufacture the body and the support portion in one piece. It may also be desirable to affix the voltage indication device to the plug via an elastically expandable portion of the body. Therefore, in certain embodiments, the body is elastically expandable. Manufacturing the body with its support portion in one piece may be particularly cost-effective. Having the entire body be elastically expandable may help attach the voltage indication device to the separable plug. The body may be elastically expandable at operating temperatures of between −20° C. and +80° C.

The voltage detector may be separate from the body. The expression "is separate from", in the context of this disclosure, refers to the voltage detector and the body being independent elements, that exist independently from each other, and that can be separated from each other without damaging any of them. In certain embodiments, the body and the voltage detector are separate from each other by virtue of the voltage detector being a self-sufficient element that can be inserted into, and removed from, a detector cavity formed by the body. In some of those embodiments, electrical contacting of the voltage detector is obtained by surface contacts, without fixed wiring.

Where the voltage detector is separate from the body, this modular construction of the voltage indication device may allow to replace only the one of the two elements that might have failed, while the other is still working. Certain repairs of the voltage indication device may thus be more cost-effective.

The voltage detector requires electrical connection with an element on medium voltage in order to detect the presence of medium voltage in the separable plug. It also requires electrical connection with an element on electrical ground, which serves as a reference potential. It is desirable to facilitate making these connections, e.g. by the body being conductive.

Therefore, in certain embodiments of the voltage indication device according to the present disclosure, the body is electrically conductive or comprises an electrically conductive portion. The conductive body, or the conductive portion of the body, may facilitate electrical connections of the voltage detector, e.g. between the ground contact and a grounded outer surface of the separable plug. It may thereby make it obsolete to provide separate electrical contacts or elements for connection of the voltage detector.

For the same purpose, a conductive body, or a conductive portion of the body, may be made of, or comprise, an electrically conductive polymeric material, such as conductive silicone, conductive EPDM rubber or an electrically conductive thermoplastic elastomer. The electrically conductive polymeric material may provide electrical conductivity to the body or to the portion of the body. Certain conductive polymers provide elastic expandability. Hence for the voltage indication device according to the present disclosure, the polymeric material may be suitably chosen to also render the body or a portion of the body, e.g. the support portion of the body, electrically conductive and elastically expandable.

Attachment of the voltage indication device to the separable plug may be done by external means, such as clamps, clips, ribbons, or the like. Alternatively, or in addition, the body of the voltage indication device may be adapted for attachment to the plug. Therefore, in certain embodiments, the body comprises attachment means for mechanical attachment to an outer surface of the separable plug. This may make external attachment means obsolete.

In certain embodiments, the voltage detector is supported on an outer (i.e. externally accessible) surface of the body, in which case the indicator may be easily externally viewable. In certain other, preferred embodiments, the voltage detector with its indicator is supported on an inner surface of the body, such as in a cavity formed by the body. In these latter embodiments, it must be ensured that the indicator is externally viewable. Therefore, in certain embodiments, the body forms an aperture through which the indicator is externally viewable. The aperture is an easy-to-manufacture means to ensure viewability of the indicator where the voltage detector is arranged on an inner surface of the body.

Alternatively, the body may comprise a transparent or translucent window to allow visual perception of the indicator through the window.

Where the body forms a detector cavity, and where the voltage detector is arranged in the detector cavity, the cavity may form an aperture through which the indicator is externally viewable.

The voltage detector may receive its power through an external power supply, independent from its voltage contact or its ground contact. It is preferred, however, that the voltage detector be a self-sufficient device, not requiring electrical connections to a separate power supply. Therefore, in certain embodiments, the voltage detector is powered by power received through the voltage contact.

Compared to the power transmitted through a separable plug in a power distribution network of a national grid, the power needed to operate the voltage detector is negligibly small. A voltage indication device in which the voltage detector is powered by power received through the voltage contact, i.e. is powered by the power distribution network, may thus be a self-sufficient, autonomous device, which does not require a separate power supply, and which is therefore easier to install and to operate.

The ground contact comprises a spring contact, e.g. a resilient spring contact. Spring contacts often facilitate easier connection to ground, because no soldering or mechanical work is required.

Similarly, in certain embodiments, the voltage contact of the voltage detector may be a soldering contact for connection to the coupling electrode via a wire. However, in alternative embodiments, and preferably, the voltage contact comprises a spring contact, e.g. a resilient spring contact, for contact with the coupling electrode.

The voltage detector comprises the indicator, and it will normally also contain electric and electronic circuitry to determine the presence of the medium voltage in the separable plug. While the circuitry may be arranged in a housing of the voltage detector for protection against mechanical or environmental effects, the indicator needs to be externally viewable. For greater protection of the voltage detector, the voltage detector may be arranged in a cavity formed by the body.

So in certain embodiments of the voltage indication device according to the present disclosure, the body forms a detector cavity, i.e. a cavity for accommodating the voltage detector. In certain other embodiments, the elastically expandable support portion forms a detector cavity. In all these embodiments, the voltage detector is arranged in the detector cavity. As stated above, the detector cavity may form an aperture through which the indicator is externally viewable.

Where the body is elastically expandable, the detector cavity is also formed by elastically expandable portions of the body, some of which may resiliently support the voltage detector. Generally, the detector cavity may comprise the elastically expandable support portion for resiliently supporting the voltage detector.

The detector cavity may surround the voltage detector on all sides. The cavity may have one or more walls, collectively surrounding the detector on all sides. The wall(s) may have an opening, e.g. an opening for inserting the voltage detector into the detector cavity, or the wall(s) may be continuous. The cavity may surround the voltage detector on all sides except on one side.

Where certain portions of the body form a detector cavity for accommodating the voltage detector therein, these portions may be electrically conductive. A detector cavity formed by electrically conductive portions of the body may provide for electrical shielding for the voltage detector, and thereby increase its detection accuracy.

The voltage detector can be kept in its position by different means. Suitable fixation means, such as clips, screws, adhesive, are known. In certain embodiments, however, and independent from the presence of a detector cavity, the voltage detector may be kept in its position by the elastically expandable support portion. For that purpose, the elastically expandable support portion may form a latch for keeping the voltage detector in place. Depending on the geometry of the voltage detector, the latch may have a circular shape or a linear shape. Where the voltage detector comprises a housing, the latch may be shaped for engagement with a corresponding element on the housing of the voltage detector.

A benefit of the support portion forming a latch for keeping the voltage detector in place is that a separate fixation for the voltage detector may not be necessary.

It may be necessary to remove the voltage detector from the support portion and/or from the remainder of the voltage indication device. Removal is quicker if it can be done manually and possibly without tools. A suitable adaptation of the support portion, e.g. an adaptation of its shape and/or its elasticity, may facilitate manual removal. Hence, in certain embodiments, the elastically expandable support portion is adapted to allow manual removal of the voltage detector from the body.

Where the body forms a detector cavity, a suitable adaptation of the detector cavity, e.g. an adaptation of its shape and/or the elasticity of its walls, may facilitate manual removal of the voltage detector from the detector cavity and from the body. Therefore, in certain embodiments in which the body of the voltage indication device forms a detector cavity, the detector cavity is adapted to allow manual removal of the voltage detector from the body.

A voltage indication device according to the present disclosure may be assembled from individual suitable parts. Individual parts may be easier to ship or to store than an assembled voltage indication device. Therefore, the present disclosure also provides a kit of parts for assembling a voltage indication device as described herein, attachable to a medium-voltage separable plug in a power distribution network of a national grid, the separable plug having a rear insert comprising a coupling electrode, the kit of parts comprising a) a voltage detector for detecting the presence of a medium voltage in the separable plug, comprising a ground contact for electrical connection to ground, a voltage contact for electrical contact to the coupling electrode, and an indicator for visually indicating presence of medium voltage in the separable plug; and b) a body comprising an elastically expandable support portion for resiliently supporting the voltage detector.

Optionally, the kit of parts may further comprise c) a separable plug for a power distribution network of a national grid, to which the body can be attached, the separable plug having a rear insert comprising a coupling electrode.

The present disclosure further provides a power distribution network comprising a separable plug having a rear insert comprising a coupling electrode, and further comprising a voltage indication device as described herein, attached to the separable plug. Networks having separable plugs equipped with voltage indication devices as described herein are safer to operate.

The present disclosure further provides a process of attaching a voltage indication device as described herein to a separable plug having a rear insert comprising a coupling electrode. The process comprises the steps of a) providing a voltage indication device as described herein; and b) attaching the voltage indication device to the separable plug such that the voltage contact contacts the coupling electrode.

Figure 2:
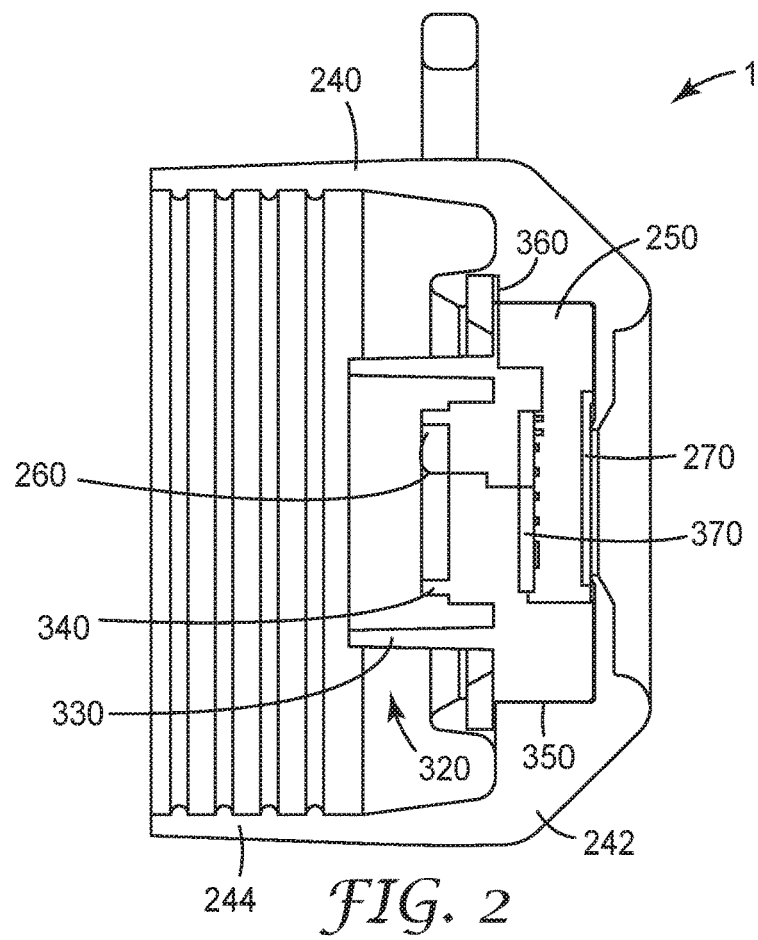
Figure 3:
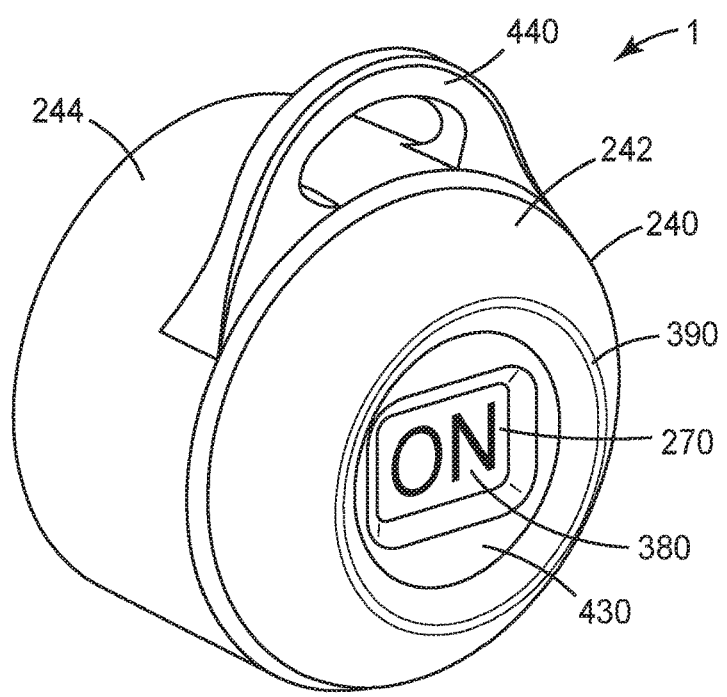
Figure 4:
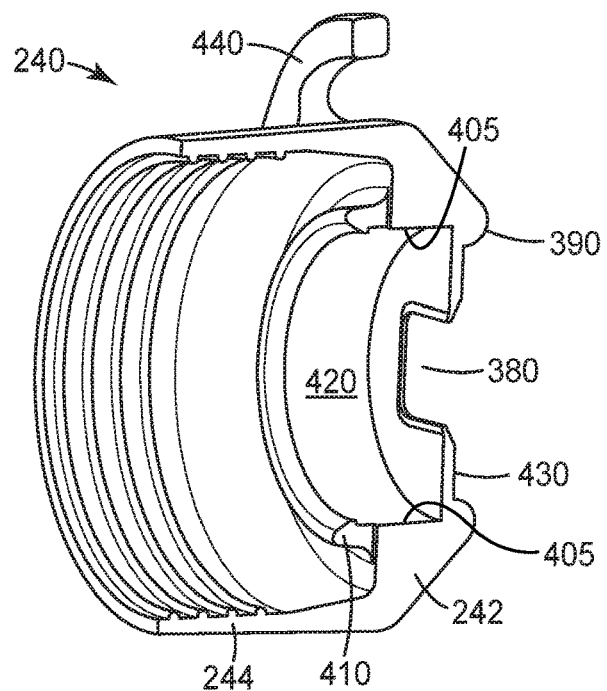
Figure 5:
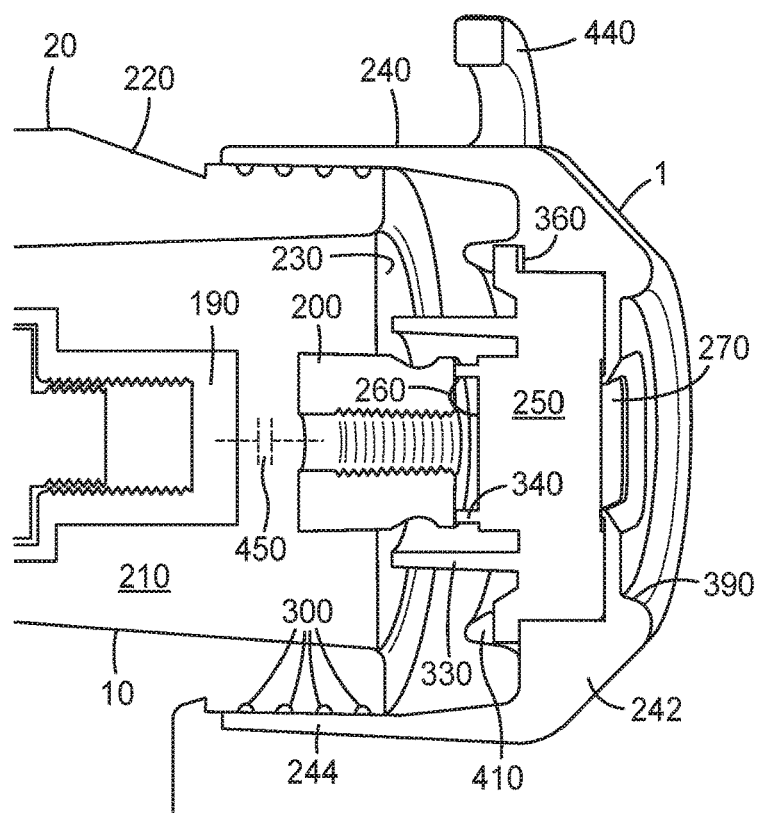
Figure 6:
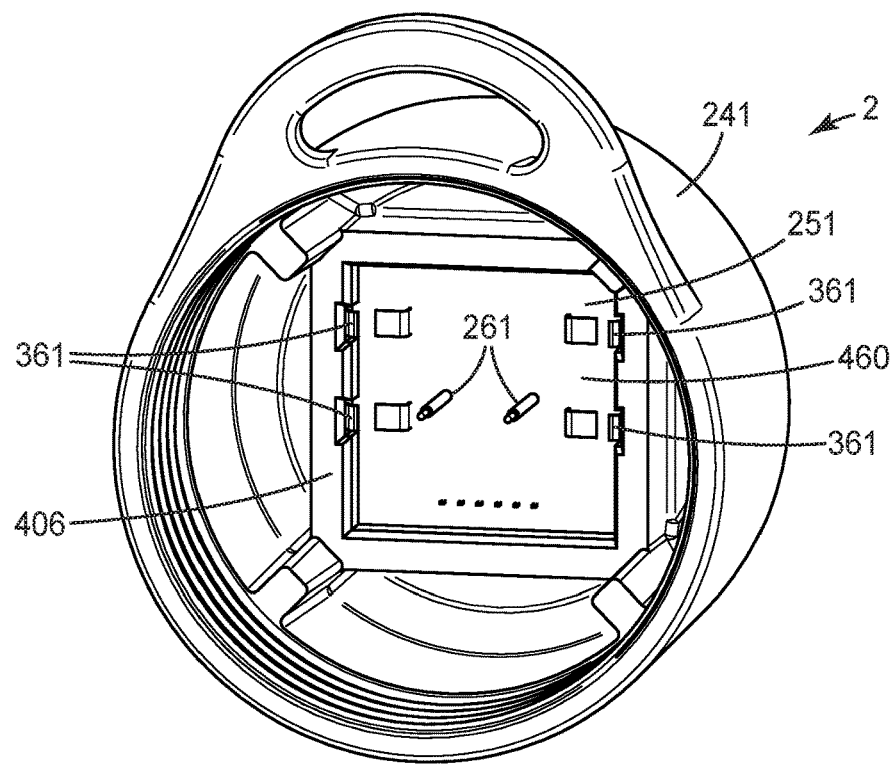
Figure 7:
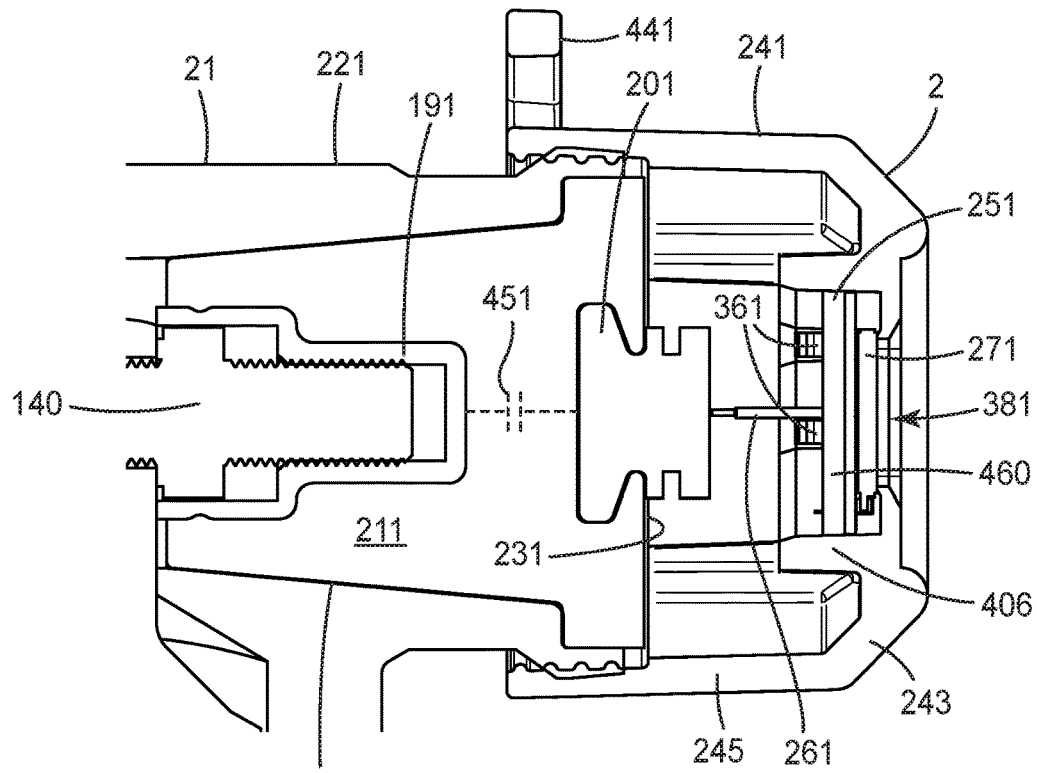

In the following, more details about the voltage indication device will be provided with reference to the following Figures exemplifying particular embodiments of the disclosure:

FIG. 1 Exploded sectional view of a separable plug, a rear insert and a first voltage indication device according to the present disclosure;

FIG. 2 Sectional view of the body and the voltage detector of the voltage indication device of FIG. 1;

FIG. 3 Perspective view of the body and the voltage detector of the voltage indication device of FIG. 1;

FIG. 4 Perspective sectional view of the body of the voltage indication device of FIG. 1;

FIG. 5 Perspective sectional view of the separable plug, the rear insert and the voltage indication device of FIG. 1 in an assembled state;

FIG. 6 Perspective view of the body and the voltage detector of a second voltage indication device according to the present disclosure; and FIG. 7 Sectional view of the second voltage indication device, applied on a separable plug.

The exploded sectional view of FIG. 1 illustrates a voltage indication device 1 according to the present disclosure, a rear insert 10, a separable plug 20, attached to an end of a medium-voltage power cable 30, and a bushing 40 of a switchgear 50, to which the cable 30 is to be attached.

The separable plug 20 receives the end of the cable 30, with the central conductor 100 of the cable 30 being connected to a plug conductor 110 which has a cable lug 120 at the connector end 130 of the separable plug 20. The cable lug 120 can be connected to the bushing 40 by a screw 140 which engages with a corresponding thread 150 in the bushing 40.

The plug 20 is provided on its outer surface with an electrically insulating jacket 160, which forms two opposed, coaxial frusto-conical cavities on opposed sides of the lug 120: A bushing cavity 170 on the bushing side of the plug 20, and an insert cavity 180 on the opposite side of the plug 20. When connecting the cable 30 to the bushing 40, the bushing cavity 170 is positioned over the bushing 40, the screw 140 is inserted into the thread 150 and tightened by turning the screw head of screw 140 which is accessible in the insert cavity 180.

The screw 140 will be on medium voltage when the central conductor 100 of the cable 30 is "live". In order to properly insulate the screw 140 and the cable lug 120 and to reduce electrical stress when the cable 30 is "live", the electrically insulating rear insert 10, formed frusto-conically to fill the insert cavity 180, is positioned in the insert cavity 180 and is connected to the screw 140 and the lug 120 by a conductive thread 190 comprised in the rear insert. The rear insert 10 also prevents inadvertent contact with the lug 120, screw 140 or the conductive thread 190, e.g. by an installer during installation.

The rear insert 10 is further equipped with a conductive coupling electrode 200 in the portion of its insulating insert body 210 which is opposite to the conductive thread 190. The coupling electrode 200 is generally used by installers as a contact for a hand-held voltage indicator. The coupling electrode 200 and the opposed conductive thread 190 form a capacitor in the rear insert 10, the dielectric of which is formed by a portion of the insert body 210. The conductive thread 190 and the coupling electrode 200 are therefore capacitively coupled with each other.

For reasons of safety, the external, i.e. accessible, surface 220 of the plug 20 is electrically conductive and held on electrical ground.

The voltage indication device 1 is for attachment to the plug 20. It comprises an electrically conductive body 240 and a voltage detector 250, which in turn features a voltage contact 260 and an indicator, namely an LCD display 270, which can be externally viewed by an observer 280. The body 240 consists of an electrically conductive polymeric material, namely electrically conductive EPDM rubber. The body 240 is axially symmetric with respect to an axis 400, and it has a central body portion 242 and a peripheral body portion 244, generally protruding from a radially peripheral edge of the central body portion 242.

The voltage contact 260 is formed as a spring contact, made of resilient conductive metal, and protrudes from the rear of the voltage detector 250 in axial direction. Due to its bent shape it can form a reliable surface contact with the coupling electrode 200, when pushed against the coupling electrode 200 with a moderate pressure.

In use, the rear insert 10 is affixed in the insert cavity 180 of the plug 20, and the voltage indication device 1 is attached to the plug 20 and covers the accessible outer surface 230 of the rear insert 10.

In the embodiment of FIG. 1, the voltage indication device 1 is attached to the plug 20 by friction: Due to its elasticity, the body 240, in particular its peripheral body portion 244, can be radially expanded when being pushed over the connector end 130 of the plug 20. As the peripheral body portion 244 strives to return to its unexpanded shape, it contracts and thereby increases the friction between its inner surface 310 and the outer surface 220 of the plug 20. For an even more reliable attachment of the voltage indication device 1 to the plug 20, the peripheral body portion 244 comprises several parallel circumferential tongues 290 on its inner surface 310. These tongues 290 can engage with a corresponding set of parallel circumferential notches 300 on the outer surface 220 of the plug 20. The tongue-notch structure provides for a more reliable engagement than friction alone. The tongues 290, however, will also facilitate reliable engagement on plugs that have no corresponding notches.

FIG. 2 is a sectional view of the body 240 and the voltage detector 250 shown in FIG. 1. On a rear side 320 of the axially symmetric housing 350 of the voltage detector 250, two coaxially arranged cylindrical walls provide for predetermined axial distance of the voltage detector 250 from elements of the rear insert 10: An outer cylindrical rear wall 330 is for abutting against the accessible outer surface 230 of the rear insert 10, while an inner cylindrical rear wall 340 is for abutting against the coupling electrode 200, thereby providing some mechanical protection for the voltage contact 260.

A ground contact 360 is arranged at the periphery of the housing 350, for establishing an electrical connection to the body 240 of the voltage indication device 1. The body 240 is electrically conductive, and due to its mechanical engagement with the outer surface 220 of the plug 20, is in electrical surface contact with this outer surface 220 of the plug 20. This outer surface 220 is normally held on electrical ground by means not discussed here. The body 240 therefore forms an electrical connection between the conductive, grounded outer surface 220 of the plug 20 and the ground contact 360 of the voltage detector 250.

The voltage detector 250 comprises a PCB 370, arranged inside the housing 350 of the voltage detector 250. Electric and electronic circuitry, electrically connected to the voltage contact 260 and the ground contact 360, is arranged on the PCB 370 to detect the divided voltage present on the coupling electrode 200 and picked up by the voltage contact 260. The circuitry is powered by the divided voltage, and when the divided voltage is present, the circuitry activates the LCD display 270 and shows the message "ON" in the display 270. When no divided voltage is present on the coupling electrode 200, the circuitry has no power, the display 270 is not activated, and no message will appear in the display 270.

The voltage indication device 1 of FIG. 2 is shown in a perspective view in FIG. 3. The central body portion 242 is shaped such as to form a circular hump 390 around the aperture 380 for the display 270. This hump 390 protrudes by a certain amount from the—otherwise mainly flat—front surface 430 of the central body portion 242 and thereby helps protect the display 270, which is exposed in the area of the aperture 380, against certain mechanical impacts and, due to the elasticity of the body 240, against damage when the voltage indication device 1 falls on a flat surface.

The body 240 further comprises a pull-off ear 440, formed as one piece with the remainder of the body 240. The pull-off ear 440 helps removing the voltage indication device 1 from the plug 20, as it allows to exert a stronger pull in axial directions. It is noted that the formation of the voltage contact 260 as a spring contact provides that the voltage detector 250 is not firmly attached to the plug 20 or to the rear insert 10 other than by friction, so that the entire voltage indication device 1 can be pulled off the plug 20 and the rear insert 10 without a need to disconnect any mechanical elements.

FIG. 4 illustrates, in a perspective sectional view, the body 240 of the voltage indication device 1 of FIG. 1.

Certain features of the body 240 can be seen more clearly when the voltage detector 250 is not shown. The central body portion 242 of the body 240 comprises an aperture 380 through which the display 270 can be viewed by an external observer 280. In alternative embodiments, the aperture 380 may be replaced with a transparent window in the body 240, to allow visual perception of a message in the display 270.

The central body portion 242 comprises, at its rear side, a circular support wall 405 protruding in axial direction. The circular support wall 405 forms an elastically expandable support portion of the body 240, which resiliently supports the voltage detector 250.

The circular support wall 405 forms, at its rear edge, an elastic circular latch 410, by means of which the voltage detector 250 is resiliently held in a detector cavity 420 formed between the circular support wall 405 and the front surface 430. When the voltage detector 250 is pushed into the detector cavity 420, the circular latch 410 expands to let the voltage detector 250 pass, then returns to its original, unexpanded shape to hold the voltage detector 250 resiliently in the detector cavity 420. The elastic latch 410 also allows manual removal of the voltage detector 250 from the detector cavity 420.

FIG. 5 shows, in a further perspective sectional view, the plug 20, the rear insert 10 and the voltage indication device 1 of FIG. 1, in an assembled state, with the voltage detector 250 arranged in the detector cavity 420. The outer cylindrical rear wall 330 abuts the accessible surface 230 of the rear insert 10, the inner cylindrical rear wall 340 abuts the coupling electrode 200, and the voltage contact 260 is in electrical surface contact with the coupling electrode 200, which in turn is capacitively coupled with the conductive thread 190. This is indicated in FIG. 5 by a capacitor symbol 450 in dotted line. The ground contact 360 is in electrical contact with the conductive body 240, which electrically connects the ground contact 360 with the grounded outer surface 220 of the separable plug 20.

The conductive thread 190 is on medium voltage, so that the coupling electrode 200, capacitively coupled to the conductive thread 190, is on an intermediate voltage, namely the detection voltage. This detection voltage powers the PCB 370 (not shown in FIG. 4) which in turn activates the display 270 and causes the message "ON" to be displayed.

In a second embodiment of the voltage indication device according to present disclosure, namely a second voltage indication device 2 shown in FIG. 6 in a perspective rear view, the voltage detector 251, resiliently supported in the body 241, does not comprise a housing, but consists of a printed circuit board ("PCB") 460 having four ground contacts 361 comprising respective spring contacts at its periphery, two resilient axially-telescoping voltage contacts 261 protruding from its rear side, and a display (not visible) on its front side. Circuitry and other elements of the PCB 460 are not shown. The elastically expandable support wall 406 is shaped suitably to resiliently support the PCB 460. The PCB 460 is held in its place by friction between the resilient ground contacts 361 and the elastically expandable support wall 406.

FIG. 7 shows, in a sectional view, the second voltage indication device 2 attached to a separable plug 21 having a rear insert 11. The separable plug 21 has the same function as the separable plug 20 shown in FIGS. 1 and 5, although its elements have slightly different geometric shapes. Also the rear insert 11 in the separable plug 21 of FIG. 7 comprises an insert body 211, a conductive thread 191, a coupling electrode 201 and an accessible outer surface 231. The conductive thread 191 and the coupling electrode 201 are capacitively coupled, as indicated by the capacitor symbol 451.

The body 241 of the voltage indication device 2 is attached to the electrically conductive outer surface 221 of the separable plug 21. The body 241 is made from an elastically expandable, electrically conductive EPDM rubber, which is a polymeric material. It comprises a central body portion 243 forming an aperture 381, and a peripheral body portion 245. The body 241 holds the voltage detector 251 resiliently via its elastically expandable support portion 406. The ground contacts 361 of the voltage detector 251 are spring contact. They are in surface contact with the body 241, which electrically connects the ground contacts 361 with the grounded outer surface 221 of the separable plug 21.

The invention claimed is:

1. Voltage indication device, attachable to a medium-voltage separable plug in a power distribution network of a national grid, wherein the separable plug has a rear insert comprising a coupling electrode, and wherein the voltage indication device comprises
   a) a body, and
   b) a voltage detector, supported by the body, for detecting presence of a medium voltage in the separable plug, the voltage detector comprising
   a ground contact for electrical connection to ground;
   a voltage contact for electrical connection to the coupling electrode; and
   an indicator for visually indicating presence of the medium voltage in the separable plug,
wherein the body comprises an elastically expandable support portion for resiliently supporting the voltage detector and in that the ground contact comprises a spring contact.

2. Voltage indication device according to claim 1, wherein the body is elastically expandable at operating temperatures of between −20° C. and +80° C.

3. Voltage indication device according to claim 1, wherein the voltage detector is separate from the body.

4. Voltage indication device according to claim 1, wherein the body is electrically conductive or comprises an electrically conductive portion.

5. Voltage indication device according to claim 1, wherein the body is made of an electrically conductive polymeric material comprising one of electricallyc conductive silicone, electrically conductive EPDM rubber, and electrically conductive thermoplastic elastomer.

6. Voltage indication device according to claim 1, wherein the body comprises attachment means for mechanical attachment to an outer surface of the separable plug.

7. Voltage indication device according to claim 1, wherein the body forms an aperture, through which the indicator is externally viewable.

8. Voltage indication device according to claim 1, wherein the voltage detector is powered by power received through the voltage contact.

9. Voltage indication device according to claim 1, wherein the voltage contact comprises a spring contact.

10. Voltage indication device according to claim 1, wherein the body forms a detector cavity, and wherein the voltage detector is arranged in the detector cavity.

11. Voltage indication device according to claim 1, wherein the elastically expandable support portion forms a latch for keeping the voltage detector in place.

12. Voltage indication device according to claim 1, wherein the elastically expandable support portion is adapted to allow manual removal of the voltage detector from the body.

13. Kit of parts for assembling a voltage indication device according to claim 1, attachable to a medium-voltage separable plug in a power distribution network of a national grid, the separable plug having a rear insert comprising a coupling electrode, the kit of parts comprising
   a) a voltage detector for detecting the presence of a medium voltage in the separable plug, comprising a ground contact comprising a spring contact for electrical connection to ground, a voltage contact for electrical contact to the coupling electrode, and an indicator for visually indicating presence of medium voltage in the separable plug; and
   b) a body comprising an elastically expandable support portion for resiliently supporting the voltage detector.

14. The kit of parts of claim 13, further comprising:
   a separable plug for a power distribution network of a national grid, to which the body can be attached, the separable plug having a rear insert comprising a coupling electrode.

15. Power distribution network comprising a separable plug having a rear insert comprising a coupling electrode, further comprising a voltage indication device according to claim 1, attached to the separable plug.

16. Process of attaching a voltage indication device to a separable plug having a rear insert comprising a coupling electrode, the process comprising the steps of
   a) providing a voltage indication device according to claim 1;
   b) arranging the voltage indication device on the separable plug such that the voltage contact contacts the coupling electrode.

* * * * *